US010630236B2

(12) United States Patent
Pai et al.

(10) Patent No.: US 10,630,236 B2
(45) Date of Patent: Apr. 21, 2020

(54) SWITCHED CAPACITANCE CIRCUIT

(71) Applicant: QUALCOMM INCORPORATED, San Diego, CA (US)

(72) Inventors: Hung-Chuan Pai, Irvine, CA (US); Tsai-Pi Hung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 228 days.

(21) Appl. No.: 15/624,744

(22) Filed: Jun. 16, 2017

(65) Prior Publication Data
US 2018/0367135 A1 Dec. 20, 2018

(51) Int. Cl.
H03B 5/12 (2006.01)
H03B 5/18 (2006.01)

(52) U.S. Cl.
CPC ......... H03B 5/1215 (2013.01); H03B 5/1212 (2013.01); H03B 5/1228 (2013.01); H03B 5/1265 (2013.01)

(58) Field of Classification Search
CPC .. H03K 17/162; H03B 5/1215; H03B 5/1212; H03B 5/1265; H03B 5/1228
USPC ...................... 331/36 C, 117 R, 117 FE, 167
See application file for complete search history.

(56) References Cited

U.S. PATENT DOCUMENTS

| | | | | |
|---|---|---|---|---|
| 7,116,183 B2 * | 10/2006 | Wu | ............. | H03B 5/04 331/176 |
| 7,463,107 B2 * | 12/2008 | Pittorino | ............. | H03B 5/1228 331/117 FE |
| 8,000,162 B2 * | 8/2011 | Kim | ............. | G11C 7/1051 331/25 |
| 2003/0146795 A1 | 8/2003 | Albon et al. | | |
| 2009/0108947 A1 | 4/2009 | Liu | | |
| 2012/0242395 A1 | 9/2012 | Ding | | |
| 2012/0274408 A1 * | 11/2012 | Kato | ............. | H03F 3/45183 331/57 |
| 2016/0112006 A1 * | 4/2016 | Rajendran | ............. | H03B 5/1228 331/117 FE |

OTHER PUBLICATIONS

Babaie M., et al., "An Ultra-Low Phase Noise Class-F2 CMOS Oscillator With 191 dBc/Hz FoM and Long-Term Reliability", IEEE Journal of Solid-State Circuits, vol. 50, No. 3, Mar. 2015, pp. 679-692.
Hershberg B., et al., "A 9.1-12.7 GHz VCO in 28nm CMOS with a Bottom-Pinning Bias Technique for Digital Varactor Stress Reduction", IEEE, European Solid State Circuits Conference (ESSCIRC), 2014, pp. 83-86.
(Continued)

Primary Examiner — Richard Tan
(74) Attorney, Agent, or Firm — Smith Temple Blaha LLC/Qualcomm

(57) ABSTRACT

A switched capacitance circuit selectively provides a capacitance across first and second output nodes in response to a selection control signal. The switched capacitance circuit may include a first capacitor coupled between the first output node and a mid-node, a second capacitor coupled between the second output node and the mid-node, and a switching circuit. The switching circuit is configured to switch the first and second capacitors in response to the selection control signal and to provide a bias voltage at the mid-node in response to the selection control signal.

14 Claims, 6 Drawing Sheets

(56) References Cited

OTHER PUBLICATIONS

Liu Y., et al., "Switchable PLL Frequency Synthesizer and Hot Carrier Effects", Circuits and Systems, vol. 2, No. 1, Jan. 2011, pp. 45-52.

Raczkowski K., et al., "A 9.2-12.7 GHz Wideband Fractional-N Subsampling PLL in 28 nm CMOS With 280 fs RMS Jitter", IEEE Journal of Solid-State Circuits, vol. 50, No. 5, May 2015, pp. 1203-1213.

\* cited by examiner

SWITCHED CAPACITANCE CIRCUIT

FIELD

The present disclosure relates generally to electronics, and more specifically to transmitter and receiver circuitry, or to circuitry which may include a switched capacitance.

BACKGROUND

Circuits having switchable or selectable capacitance are used in various applications. For example, a voltage-controlled oscillator (VCO) may include a capacitor bank comprising a number of switched capacitance cells or units electrically connected in parallel with each other. The switched capacitance cells may be individually switchable or selectable. A selected subset of the capacitance cells provides the VCO with capacitance to achieve a desired oscillation frequency. A VCO may be used in radio frequency (RF) transmitter or receiver circuitry. In a RF transmitter or receiver, rapid tuning or changing of operating frequency may be desirable.

SUMMARY

Various implementations of systems, methods, and apparatuses within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a switched capacitance circuit for selectively providing a capacitance across first and second output nodes in response to a selection control signal. The switched capacitance circuit may include a first capacitor coupled between the first output node and a mid-node, a second capacitor coupled between the second output node and the mid-node, and a switching circuit. The switching circuit is configured to switch the first and second capacitors in response to the selection control signal and to provide a bias voltage at the mid-node in response to the selection control signal.

Another aspect of the disclosure provides a method for selectively providing a capacitance in a switched capacitance circuit in response to a selection control signal. The switched capacitance circuit may include a first capacitor coupled between a first output node and a mid-node, and a second capacitor coupled between a second output node and the mid-node. The method may include receiving the selection control signal, which has a state representing either de-selection of the switched capacitance circuit or selection of the switched capacitance circuit. The method may further include switching the first and second capacitors in response to the selection control signal and selectively providing a bias voltage at a mid-node in response to the selection control signal. The capacitance is selectively provided between the first output node and the second output node.

Still another aspect of the disclosure provides a switched capacitance apparatus for selectively providing a capacitance in response to a selection control signal. The apparatus may include means for receiving the selection control signal, which has a state representing either de-selection of the switched capacitance apparatus or selection of the switched capacitance apparatus. The switched capacitance apparatus may further include means for selectively providing a bias voltage at a mid-node in response to the selection control signal. The switched capacitance apparatus may also include means for switching first and second capacitors of the switched capacitance apparatus and for selectively providing the capacitance between a first output node and a second output node, wherein the first capacitor is coupled between the first output node and the mid-node, and the second capacitor is coupled between the second output node and the mid-node.

Yet another aspect of the disclosure provides a switch circuit. The circuit may include a first capacitor coupled to a first output node, a second capacitor coupled to a second output node, a first transistor coupled between the first capacitor and a mid-node, a second transistor coupled between the second capacitor and the mid-node, and third transistor coupled between the mid-node and a supply. The third transistor may comprise a gate coupled to a control.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects. The word "coupled" is used herein to mean connected through zero or more intermediate elements. The term "connected directly" is used herein to mean connected through no intermediate elements.

Improvements in semiconductor fabrication techniques have resulted in transistors capable of high-speed switching. In accordance with one such technique, high-speed transistors may have thinner oxide layers than lower-speed transistors. The thin oxide layer may render such high-speed transistors more vulnerable to adverse effects on mobility, threshold voltage, intrinsic noise, or other transistor characteristics, which may correspondingly degrade performance of the transistor. In the context of measuring the extent of such adverse effects, the term "stress voltage" may be used to refer to a possibly harmful voltage between any two terminals of a transistor. To help minimize such adverse effects, it is desirable to minimize stress voltages. The term "stress tolerance" may be used to refer to the ability of a transistor to withstand a voltage higher than the rated operating voltage of the transistor. For example, in an instance in which a transistor has a rated operating voltage of 1.2 volts (V), and a safety margin of 20% is imposed, the maximum stress tolerance of the transistor would be about 1.4 volts. In an instance in which the voltage across any two terminals of the transistor exceeds 1.4V, the transistor's maximum stress tolerance is exceeded, and the transistor is said to be operating under stress. VCO switched capacitance cells are known. However, such prior circuitry may suffer disadvantages such as additional noise and added complexity.

Figure 1:
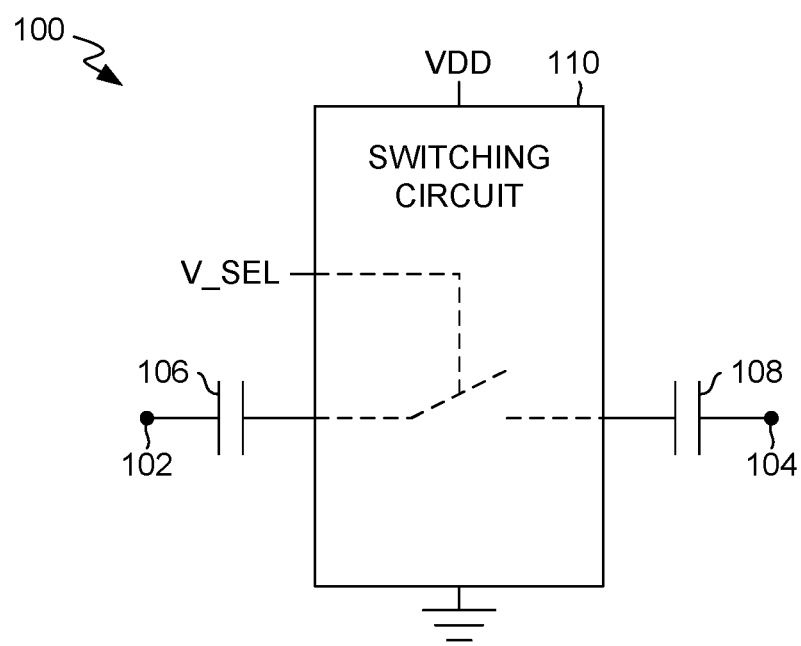
FIG. 1 is a block diagram of a switched capacitance circuit.

FIG. 1 illustrates an exemplary switched capacitance circuit 100 for selectively providing a capacitance between a first output node 102 and a second output node 104 in response to a selection control signal (V_SEL). Another system or circuitry (i.e., external to switched capacitance circuit 100 and not shown in FIG. 1), which may be of any type, may switch the capacitance into (i.e., connect the capacitance to) such external circuitry by asserting V_SEL or switch the capacitance out of (i.e., disconnect the capacitance from) the external circuitry by de-asserting V_SEL. When V_SEL is asserted, switched capacitance circuit 100 is "selected," and when V_SEL is de-asserted, switched capacitance circuit 100 is "de-selected." The selection control signal (V_SEL) thus has two states, one of which represents selection of switched capacitance circuit 100 and the other of which represents de-selection of switched capacitance circuit 100. The states in which switched capacitance circuit 100 is selected and de-selection may correspond to VSEL having a binary value of "1" and "0," respectively. Thus, in response to assertion of V_SEL (e.g., VSEL=1), representing selection of switched capacitance circuit 100, the capacitance is provided between first output node 102 and second output node 104. Conversely, in response to de-assertion of V_SEL (e.g., VSEL=0), representing de-selection of switched capacitance circuit 100, the capacitance is not provided between first output node 102 and second output node 104. V_SEL may be provided by any number of elements or devices. For example, a controller, processor, DAC, etc. may be coupled to the circuit 100 and configured to provide V_SEL or another control.

Switched capacitance circuit 100 may include a first capacitor 106, a second capacitor 108, and a switching circuit 110. The switching function of switching circuit 110 is conceptually depicted in FIG. 1 (as indicated in broken line) in the form of a switch that opens and closes in response to V_SEL. Although depicted in this conceptual manner in FIG. 1 for purposes of clarity, as described below, switching circuit 110 comprises circuitry (e.g., transistor-based circuitry) that may both switch first and second capacitors 106 and 108 in response to V_SEL and concurrently provide a bias voltage in response to V_SEL. This transistor-based circuitry, examples of which are described below with regard to FIGS. 2 and 3, may, among other things, reduce transistor stress voltages over prior techniques and require less circuit complexity (e.g., fewer components) than prior techniques.

Figure 2:
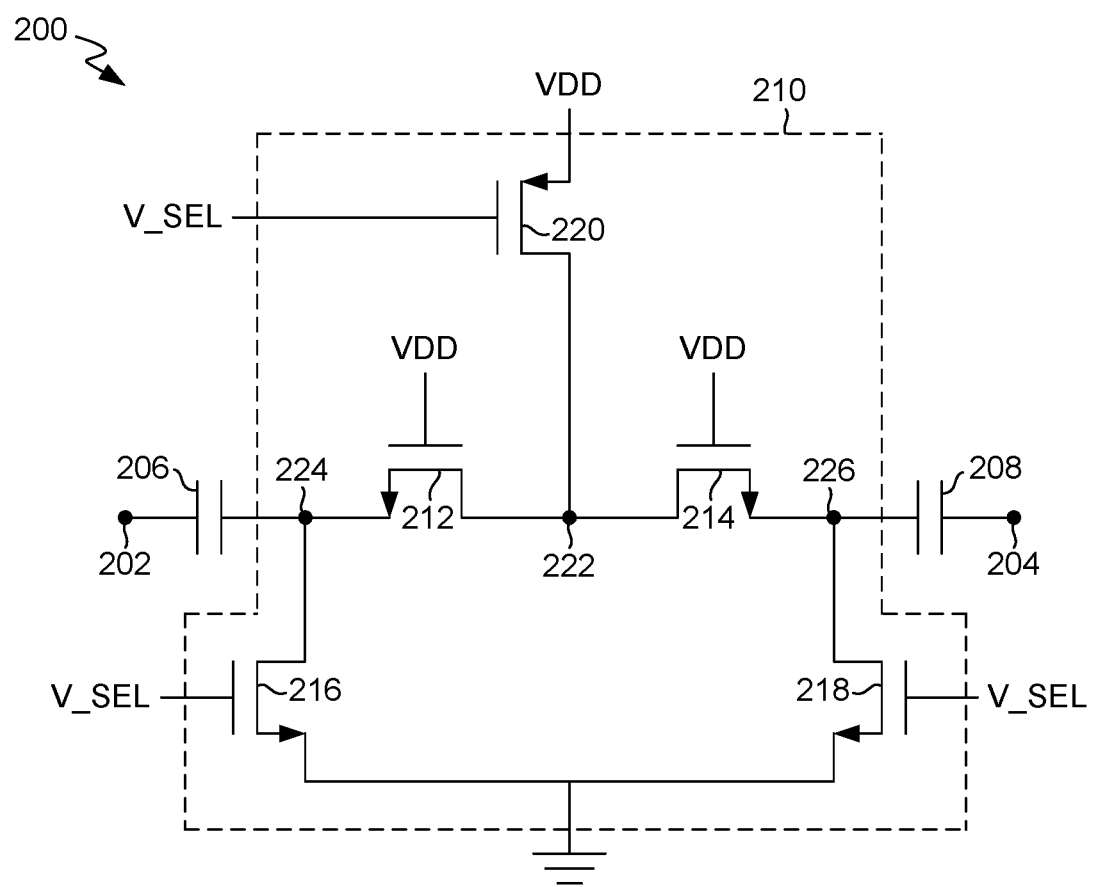
FIG. 2 is a schematic circuit diagram of the switched capacitance circuit of FIG. 1, in accordance with one exemplary embodiment.

FIG. 2 illustrates an exemplary switched capacitance circuit 200 for selectively providing a capacitance between a first output node 202 and a second output node 204 in response to V_SEL. In response to assertion of V_SEL (e.g., VSEL=1), representing selection of switched capacitance circuit 200, the capacitance is provided between first output node 202 and second output node 204. Conversely, in response to de-assertion of V_SEL (e.g., VSEL=0), representing de-selection of switched capacitance circuit 200, the capacitance is not provided between first output node 202 and second output node 204.

Except as described below, exemplary switched capacitance circuit 200 may be similar to exemplary switched capacitance circuit 100 (FIG. 1). Accordingly, switched capacitance circuit 200 may include a first capacitor 206, a second capacitor 208, and a switching circuit 210. Switching circuit 210 comprises an example of the above-referenced transistor-based circuitry of switching circuit 110 (FIG. 1).

In exemplary switched capacitance circuit 200, switching circuit 210 includes a first source-follower transistor 212, a second source-follower transistor 214, a first pull-down transistor 216, a second pull-down transistor 218, and a pull-up transistor 220. A mid-node 222 is defined between first and second source-follower transistors 212 and 214. The term "source-follower" is used for convenience in referring to first and second source-follower transistors 212 and 214 based on the transistor's configuration or function responsive to a state of V_SEL representing de-selection of switched capacitance circuit 200, such as approximately 0V or ground potential in the examples below. That is, when switched capacitance circuit 200 is de-selected, first and second source-follower transistors 212 and 214 function as source-followers. However, it should be noted that when switched capacitance circuit 200 is selected, first and second source-follower transistors 212 and 214 function as switches rather than source-followers. The terms "pull-down" and "pull-up" in the context of a device such as a transistor refer to the device's configuration to apply ground potential and a positive voltage, respectively, to a circuit node. In the exemplary embodiment illustrated in FIG. 2, first and second source-follower transistors 212 and 214 and first and second pull-down transistors 216 and 218 may be n-channel metal oxide semiconductor (NMOS) transistors, while pull-up transistor 220 may be a p-channel MOS (PMOS) transistor.

First capacitor 206 is coupled between first output node 202 and mid-node 222. For example, one terminal of first capacitor 206 may be connected directly to first output node 202, and the other terminal of first capacitor 206 may be connected directly to a first circuit node 224. The source terminal of first source-follower transistor 212 may also be connected directly to first circuit node 224, and the drain terminal of first source-follower transistor 212 may be connected directly to mid-node 222.

Second capacitor 208 is coupled between second output node 204 and mid-node 222. For example, one terminal of second capacitor 208 may be connected directly to second output node 204, and the other terminal of second capacitor 208 may be connected directly to a second circuit node 226. The source terminal of second source-follower transistor 214 may be connected directly to second circuit node 226, and the drain terminal of second source-follower transistor 214 may be connected directly to mid-node 222. The gate terminals of first source-follower transistor 212 and second source-follower transistor 214 may be coupled to or connected directly to a supply voltage (VDD). Pull-up transistor 220 is configured to selectively provide a supply voltage to mid-node 222 in response to V_SEL. For example, the source terminal of pull-up transistor 220 may be coupled to or directly connected directly to the supply voltage (VDD), the drain terminal of pull-up transistor 220 may be connected directly to mid-node 222, and the gate terminal of pull-up transistor 220 may receive V_SEL.

First pull-down transistor 216 is coupled between first capacitor 206 and first source-follower transistor 212 and is configured to be selectively switchable in response to the selection control signal. For example, the source terminal of first pull-down transistor 216 may be connected directly to circuit ground, the drain terminal of first pull-down transistor 216 may be connected directly to first circuit node 224, and the gate terminal of first pull-down transistor 216 may receive V_SEL. First pull-down transistor 216 is configured to provide a ground potential to first circuit node 224, i.e., pull first circuit node 224 down to ground potential, in response to a state of V_SEL representing selection of switched capacitance circuit 200. A state of V_SEL representing selection of switched capacitance circuit 200 may be, for example, about 0.85 volts (V), which may be the supply voltage (VDD). Thus, in this exemplary embodiment applying a selection control signal (V_SEL) of, for example, approximately 0.85V to the gate terminal of first pull-down transistor 216 turns first pull-down transistor 216 "on" (i.e., first pull-down transistor 216 becomes conductive), which provides a low-impedance path between ground and first circuit node 224. A state of V_SEL representing de-selection of switched capacitance circuit 200 may be, for example, approximately 0V or ground potential. Thus, applying a selection control signal (V_SEL) of, for example, approximately 0V to the gate terminal of first pull-down transistor 216 turns first pull-down transistor 216 "off" (i.e., first pull-down transistor 216 becomes non-conductive), which provides a high-impedance between ground and first circuit node 224. Although in the exemplary embodiments disclosed herein the supply voltage may be approximately 0.85V and the two states of V_SEL may be approximately 0.85V and approximately 0V, in other embodiments the supply voltage and the two states of such a selection control signal may have any other values.

Second pull-down transistor 218 is coupled between second capacitor 208 and second source-follower transistor 214 and is configured to be selectively switchable in response to V_SEL in the same manner described above with regard to first pull-down transistor 218. For example, the source terminal of second pull-down transistor 218 may be connected directly to circuit ground, the drain terminal of second pull-down transistor 218 may be connected directly to second circuit node 226, and the gate terminal of second pull-down transistor 218 may receive V_SEL. Second pull-down transistor 218 is configured to provide the ground potential to second circuit node 226, i.e., pull first circuit node 224 down to ground potential, in response to a state of V_SEL representing selection of switched capacitance circuit 200, such as, for example, the above-referenced 0.85V.

In the exemplary manner described above, switching circuit 210 may be configured to selectively switch first and second capacitors 206 and 208 in response to the selection control signal (V_SEL) and to selectively provide a bias voltage at mid-node 222 in response to the same selection control signal (V_SEL). Note that in this exemplary embodiment this bias voltage selectively provided at mid-node 222 is the same as the supply voltage (VDD), such as, for example, approximately 0.85V. Also note that in this exemplary embodiment the bias voltage selectively provided at mid-node 222 is the sole bias voltage in switching circuit 210 (i.e., there is no other bias generation circuitry in switching circuit 210), thus helping to minimize circuit complexity or number of components. It can further be noted that in this exemplary embodiment there are no resistors in switching circuit 210, because charging/discharging capacitors through such resistors may reduce switching speed. Resistors also may occupy more chip area than transistors. In this exemplary embodiment, switching circuit 210 consists only of transistors 212, 214, 216, 218, and 220. In other embodiments, one or more resistors may be coupled between one or more of the transistors and an illustrated circuit node, and/or between a voltage and one or more of the resistors.

Pull-up transistor 220 thus provides the supply voltage (VDD) to mid-node 222, i.e., pulls mid-node 222 up to the supply voltage, in response to a state of the selection control signal (V_SEL) representing de-selection of switched capacitance circuit 200, such as, for example, approximately 0V. In this exemplary embodiment, applying 0V to the gate of pull-up transistor 220 turns pull-up transistor 220 "on" (because in this exemplary embodiment pull-up transistor 220 is PMOS rather than NMOS), which provides a low-impedance path between the supply voltage (VDD) and mid-node 222. Thus, when switched capacitance circuit 200 is de-selected, the supply voltage (VDD) may be provided to mid-node 222 as a bias voltage.

When switched capacitance circuit 200 is selected, the supply voltage (VDD) is not provided to mid-node 222. Rather, when switched capacitance circuit 200 is selected, pull-up transistor 220 is "off," i.e., does not conduct. As described above, when switched capacitance circuit 200 is selected, first pull-down transistor 216 may provide the ground potential to first circuit node 224, and second pull-down transistor 218 may provide the ground potential to second circuit node 226. First source-follower transistor 212 and second source-follower transistor 214 may serve as buffers to conduct the ground potential to mid-node 222. Accordingly, when switched capacitance circuit 200 is selected in this example, first source-follower transistor 212 experiences a drain-to-source voltage of approximately 0V, a gate-to-drain voltage of approximately 0.85V, and a gate-to-source voltage of approximately 0.85V, none of which exceed the maximum stress tolerance of first source-follower transistor 212, which may be, for example, approximately 2V. For the same reason, second source-follower transistor 214 does not experience any stress voltages that exceed its maximum stress tolerance, which may be, for example, approximately 2V.

Also, when switched capacitance circuit 200 is selected in this example, first pull-down transistor 216 experiences a drain-to-source voltage of approximately 0V, a gate-to-drain voltage of approximately 0.85V, and a gate-to-source voltage of approximately 0.85V, none of which exceed the maximum stress tolerance of first pull-down transistor 216, which may be, for example, approximately 2V. For the same reason, second pull-down transistor 218 does not experience any stress voltages that exceed its maximum stress tolerance, which may be, for example, approximately 2V.

Further, when switched capacitance circuit 200 is selected in this example, pull-up transistor 220 experiences a drain-to-source voltage of approximately 0.85V, a gate-to-drain voltage of approximately 0.85V, and a gate-to-source voltage of approximately 0V, none of which exceed the maximum stress tolerance of pull-up transistor 220, which may be, for example, approximately 2V.

Note that when switched capacitance circuit 200 is selected, none of first and second source-follower transistors 212 and 214, first and second pull-down transistors 216 and 218, and pull-up transistor 220 experience stress voltages that exceed their maximum stress tolerances, regardless of whether a VCO or other external system or circuit may be applying a signal across first and second output nodes 202 and 204. Further, when switched capacitance circuit 200 is de-selected under typical operating conditions, the bias voltage applied to mid-node 222 may protect some of transistors 212-220 against experiencing stress voltages that exceed their stress tolerances, as illustrated by the following examples.

In one exemplary instance of operation, a VCO or other external system or circuitry (not shown in FIG. 2) may de-select switched capacitance circuit 200 while applying an RF signal varying between a minimum voltage of approximately 0.6V and a maximum voltage of approximately 2.2V across first and second output nodes 202 and 204. In this exemplary instance of operation, first pull-down transistor 216 is "off" and experiences a drain-to-source voltage of approximately 1.85V rms, a gate-to-drain voltage of approximately −1.85V rms, and a gate-to-source voltage of approximately 0V, none of which exceed the maximum stress tolerance of first pull-down transistor 216. For the same reason, in this exemplary instance of operation second pull-down transistor 218 does not experience any stress voltages that exceed its maximum stress tolerance. Also, in this exemplary instance of operation, first source-follower transistor 212 experiences a drain-to-source voltage of approximately 1.35V rms, a gate-to-source voltage of approximately −1.35V rms, and a gate-to-drain voltage of approximately 0V, none of which exceed the stress tolerance of first source-follower transistor 212. For the same reason, second source-follower transistor 214 does not experience any stress voltages that exceed its maximum stress tolerance. Further, in this exemplary instance of operation, pull-up transistor 220 is "on" and experiences a drain-to-source voltage of approximately 0V, a gate-to-drain voltage of approximately −0.85V, and a gate-to-source voltage of approximately −0.85V, none of which exceed the maximum stress tolerance of pull-up transistor 220.

In another exemplary instance of operation, a VCO or other external system or circuitry may de-select switched capacitance circuit 200 while applying an RF signal varying between a minimum voltage of approximately 0.7V and a maximum voltage of approximately 1.35V across first and second output nodes 202 and 204. In this exemplary instance of operation, first pull-down transistor 216 is "off" and experiences a drain-to-source voltage of approximately 1.24V rms, a gate-to-drain voltage of approximately −1.24V rms, and a gate-to-source voltage of approximately 0V, none of which exceed the maximum stress tolerance of first pull-down transistor 216. For the same reason, in this exemplary instance of operation second pull-down transistor 218 does not experience any stress voltages that exceed its stress tolerance. Also, in this exemplary instance of operation, first source-follower transistor 212 experiences a drain-to-source voltage of approximately 0.5V rms, a gate-to-source voltage of approximately −0.5V rms, and a gate-to-drain voltage of approximately 0V, none of which exceed the stress tolerance of first source-follower transistor 212. For the same reason, second source-follower transistor 214 does not experience any stress voltages that exceed its stress tolerance. Further, in this exemplary instance of operation, pull-up transistor 220 is "on" and experiences a drain-to-source voltage of approximately 0V, a gate-to-drain voltage of approximately −0.85V, and a gate-to-source voltage of approximately −0.85V, none of which exceed the stress tolerance of pull-up transistor 220.

Figure 3:
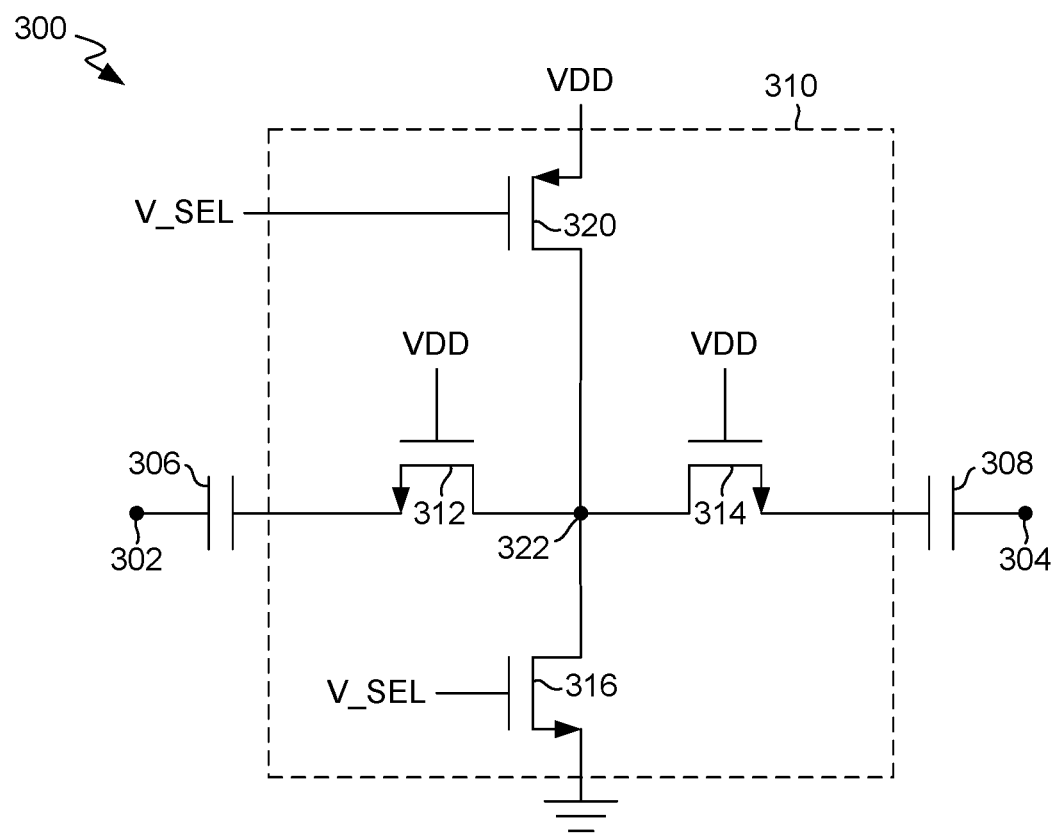
FIG. 3 is a circuit diagram of the switched capacitance circuit of FIG. 1, in accordance with another exemplary embodiment.

FIG. 3 illustrates another exemplary switched capacitance circuit 300 for selectively providing a capacitance between a first output node 302 and a second output node 304 in response to a selection control signal (V_SEL). Except as described below, exemplary switched capacitance circuit 300 may be similar to exemplary switched capacitance circuit 200 (FIG. 2). Accordingly, switched capacitance circuit 300 may include a first capacitor 306, a second capacitor 308, and a switching circuit 310. Switching circuit 310 comprises another example of the transistor-based circuitry of switching circuit 110 (FIG. 1).

Switching circuit 310 includes a first source-follower transistor 312, a second source-follower transistor 314, a mid-node pull-down transistor 316, and a pull-up transistor 320. A mid-node 322 is defined between first and second source-follower transistors 312 and 314. In the exemplary embodiment illustrated in FIG. 3, first and second source-follower transistors 312 and 314 and mid-node pull-down transistor 316 may be NMOS, while pull-up transistor 320 may be PMOS.

First capacitor 306 is coupled between first output node 302 and mid-node 322. For example, one terminal of first capacitor 306 may be connected directly to first output node 302, and the other terminal of first capacitor 306 may be connected directly to the source terminal of first source-follower transistor 312. The drain terminal of first source-follower transistor 312 may be connected directly to mid-node 322.

Second capacitor 308 is coupled between second output node 304 and mid-node 322. For example, one terminal of second capacitor 308 may be connected directly to second output node 304, and the other terminal of second capacitor 308 may be connected directly to the source terminal of second source-follower transistor 314. The drain terminal of second source-follower transistor 314 may be connected directly to mid-node 322. The gate terminals of first source-follower transistor 312 and second source-follower transistor 314 may be coupled to or connected directly to a supply voltage (VDD). Pull-up transistor 320 is configured to selectively provide the supply voltage (VDD) to mid-node 322 in response to V_SEL. For example, the source terminal of pull-up transistor 320 may be coupled to or connected directly to the supply voltage (VDD), the drain terminal of pull-up transistor 320 may be connected directly to mid-node 322, and the gate terminal of pull-up transistor 320 may receive V_SEL.

Mid-node pull-down transistor 316 is coupled between first capacitor 306 and first source-follower transistor 312 and is configured to be selectively switchable in response to V_SEL. For example, the source terminal of mid-node pull-down transistor 316 may be connected directly to circuit ground, the drain terminal of mid-node pull-down transistor 316 may be connected directly to mid-node 322, and the gate terminal of mid-node pull-down transistor 316 may receive V_SEL. Mid-node pull-down transistor 316 is configured to provide the ground potential to mid-node 322, i.e., pull mid-node 322 down to ground potential, in response to a state of V_SEL representing selection of switched capacitance circuit 300. A state of V_SEL representing selection of switched capacitance circuit 300 may be, for example, approximately 0.85 volts (V), which may be the supply voltage (VDD), as in the embodiment described above with regard to FIG. 2. Thus, in this exemplary embodiment applying a selection control signal (V_SEL) of, for example, approximately 0.85V to the gate terminal of mid-node pull-down transistor 316 turns mid-node pull-down transistor 316 "on," which provides a low-impedance path from ground to mid-node 322. A state of V_SEL representing de-selection of switched capacitance circuit 300 may be, for example, approximately 0V or ground potential, as in the embodiment described above with regard to FIG. 2. Thus, applying a selection control signal (V_SEL) of, for example, approximately 0V to the gate terminal of mid-node pull-down transistor 316 turns mid-node pull-down transistor 316 "off," which provides a high-impedance between ground and mid-node 322.

In the manner described above, switching circuit 310 may be configured to selectively switch first and second capacitors 306 and 308 in response to V_SEL and to selectively provide a bias voltage at mid-node 322 in response to the same selection control signal (V_SEL). Note that in this exemplary embodiment this bias voltage selectively provided at mid-node 322 is the same as the supply voltage (VDD). Also note that in this exemplary embodiment the bias voltage selectively provided at mid-node 322 is the sole bias voltage in switching circuit 310 (i.e., there is no other bias generation circuitry in switching circuit 310), thus helping to minimize circuit complexity or number of components. It can further be noted that in this exemplary embodiment there are no resistors in switching circuit 310. In this exemplary embodiment, switching circuit 310 consists only of transistors 312, 314, 316, and 320. In other embodiments, one or more resistors may be coupled between one or more of the transistors and node 322, between one or more of the transistors 312, 314 and capacitors 306, 308, and/or between a voltage and one or more of the resistors.

Pull-up transistor 320 thus may provide the supply voltage (VDD) to mid-node 322, i.e., pulls mid-node 322 up to the supply voltage, in response to a state of the selection control signal (V_SEL) representing de-selection of switched capacitance circuit 300, such as, for example, approximately 0V. In this exemplary embodiment, applying approximately 0V to the gate of pull-up transistor 320 turns pull-up transistor 320 "on" (because in this exemplary embodiment pull-up transistor 220 is PMOS rather than NMOS), which provides a low-impedance path from the supply voltage (VDD) to mid-node 322. Thus, when switched capacitance circuit 300 is de-selected, the supply voltage (VDD) may be provided to mid-node 322 as a bias voltage.

When switched capacitance circuit 300 is selected, the supply voltage (VDD) may not be provided to mid-node 322. Rather, when switched capacitance circuit 300 is selected, pull-up transistor 320 is "off," i.e., does not conduct. As described above, when switched capacitance circuit 300 is selected, mid-node pull-down transistor 316 may provide the ground potential to mid-node 322.

For the same reasons discussed above with regard to the embodiment shown in FIG. 2, none of first and second source-follower transistors 312 and 314, mid-node pull-down transistor 316, and pull-up transistor 320 experience stress voltages that exceed their maximum stress tolerances under typical operating conditions. For the same reasons discussed above, when switched capacitance circuit 300 is de-selected under typical operating conditions, the bias voltage applied to mid-node 322 protects one or more of transistors 312-320 against experiencing stress voltages that exceed their maximum stress tolerances. While FIGS. 2 and 3 have been illustrated with transistors having particular characteristics such as PMOS or NMOS, those skill in the art will appreciate that other configurations may be implemented according to the disclosure above.

Figure 4:
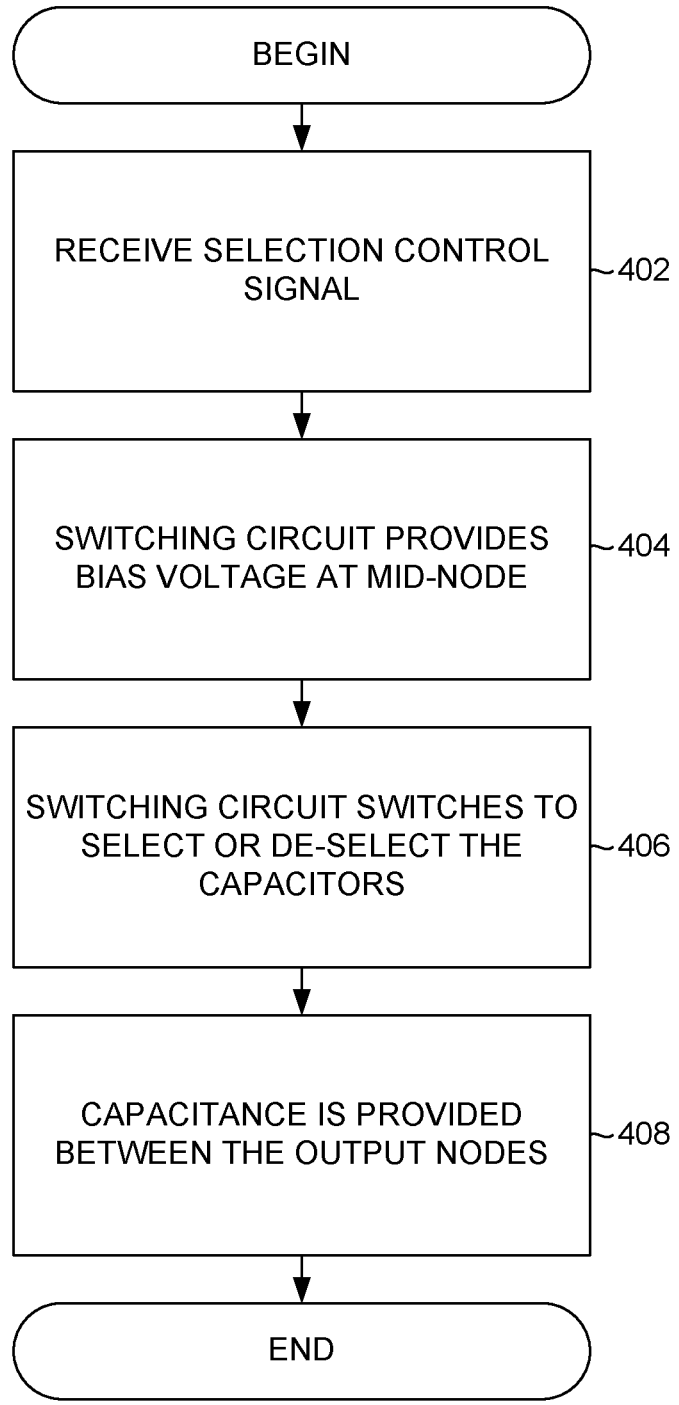
FIG. 4 is a flow diagram illustrating an exemplary method of operation of the switched capacitance circuit.

FIG. 4 is a flow diagram illustrating an exemplary method of operation of a switched capacitance circuit in accordance with the present disclosure, such as the above-described exemplary switched capacitance circuits 100, 200, and 300. The order in which the acts or steps of the method are described below is intended only to serve as an example. One or ordinary skill in the art recognizes that some acts or steps may occur before, after, or in parallel (i.e., substantially concurrently) with other acts or steps. As indicated by block 402, the switched capacitance circuit receives a selection control signal. As indicated by block 404, a switching circuit of the switched capacitance circuit selectively provides a bias voltage at a mid-node between first and second capacitors in response to the selection control signal. For example, the switching circuit may provide the bias voltage to the mid-node in response to a state of the selection control signal representing de-selection of the switched capacitance circuit and not provide the bias voltage to the mid-node in response to a state of the selection control signal representing selection of the switched capacitance circuit. As indicated by block 406, the switching circuit also switches the first and second capacitors in response to the selection control signal. As indicated by block 408, the switched capacitance circuit selectively provides a capacitance between first and second output nodes, wherein the first capacitor is coupled between the first output node and the mid-node, and the second capacitor is coupled between the second output node and the mid-node. That is, referring again to block 406, the switching circuit may provide or couple the capacitance between the first and second output nodes in response to a state of the selection control signal representing selection of the switched capacitance circuit and not provide the capacitance between the first and second output nodes (i.e., de-couple the capacitance from between the first and second output nodes) in response to a state of the selection control signal representing de-selection of the switched capacitance circuit.

Figure 5:
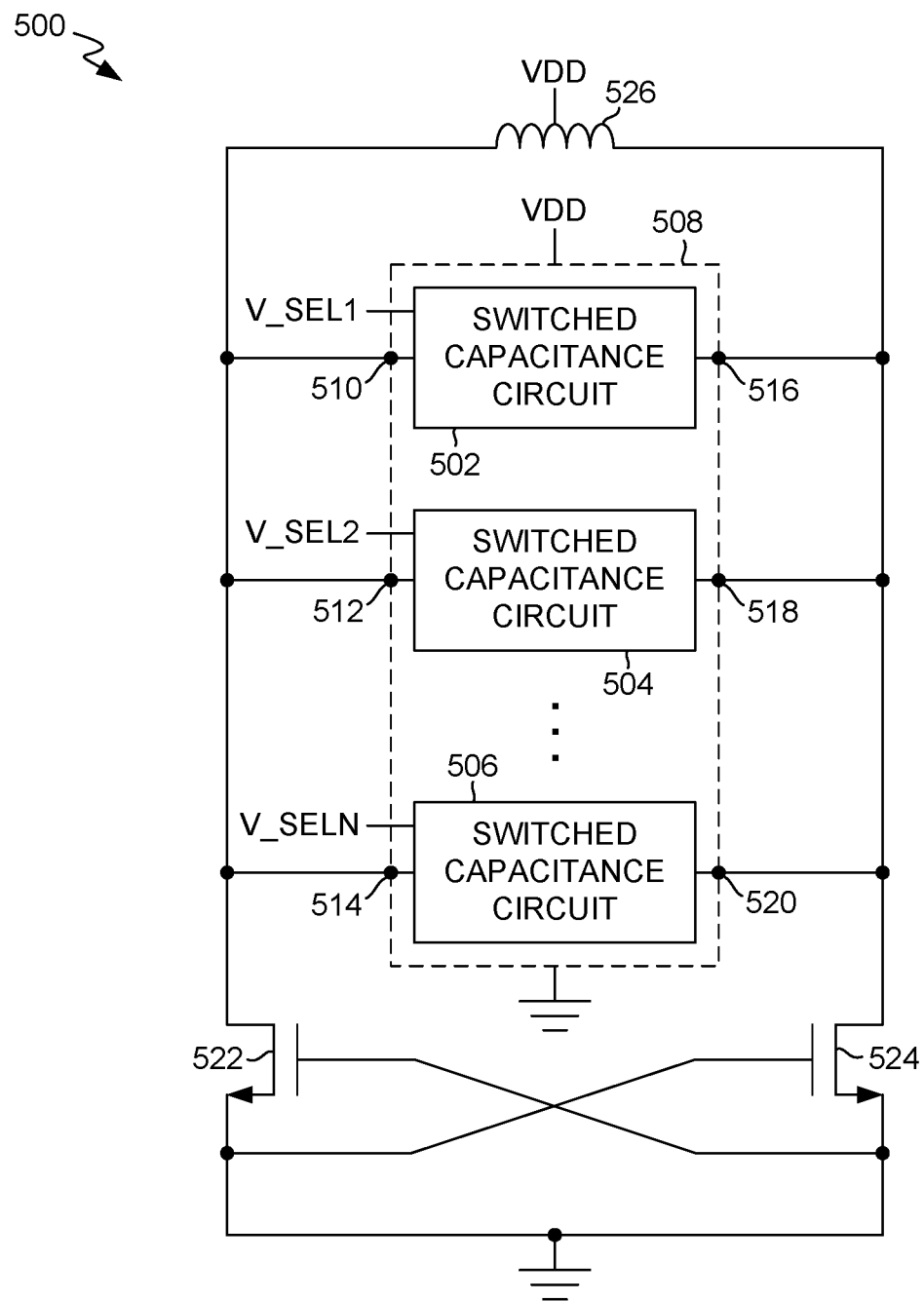
FIG. 5 is a circuit diagram of a voltage-controlled oscillator having a switched capacitance circuit.

FIG. 5 is a circuit diagram of an exemplary voltage-controlled oscillator (VCO) 500 having a plurality of switched capacitance circuits 502, 504, 506, etc. The VCO 500 may have any number (N) of switched capacitance circuits 502, 504, 506, etc., with those not shown in FIG. 5 for purposes of clarity being indicated by the ellipsis (" . . . ") symbol. Each of switched capacitance circuits 502, 504, 506, etc., may have a structure similar to and operate in a manner similar to the structure and operation described above with regard to any of switched capacitance circuits 100, 200, and 300. The plurality of switched capacitance circuits 502, 504, 506, etc., together define a capacitor bank 508 in the illustrated embodiment. Switched capacitance circuits 502, 504, 506, etc., are coupled in parallel with each other. That is, respective input nodes 510, 512, 514, etc., of switched capacitance circuits 502, 504, 506, etc., are coupled to each other, and respective output nodes 516, 518, 520, etc., of switched capacitance circuits 502, 504, 506, etc., are coupled to each other. Each of switched capacitance circuits 502, 504, 506, etc., receives a respective selection control signal from V_SEL1 through V_SELN. Switched capacitance circuits 502, 504, 506, etc., thus define individually selectable cells of capacitor bank 508. As understood by one of ordinary skill in the art, additional VCO control circuitry (not shown for purposes of clarity), which may be conventional, generates these N selection control signals based on a selected frequency of operation of VCO 500. The total capacitance of capacitor bank 508 is determined by the parallel combination of the selected ones of switched capacitance circuits 502, 504, 506, etc.

The remaining circuitry of VCO 500 may be conventional and may include, for example, a cross-coupled pair of transistors 522 and 524 and an inductor 526. Additional circuitry may be included in VCO 500 but is not shown for purposes of clarity. In operation, the total capacitance of capacitor bank 508 (determined by the parallel combination of the selected ones of switched capacitance circuits 502, 504, 506, etc.) is coupled to inductor 526 and the cross-coupled pair of transistors 522 and 524. As a result, VCO 500 oscillates at a selected frequency based on the total capacitance of capacitor bank 508, the inductance of inductor 526, and other factors. Although in the illustrated embodiment switched capacitance circuits 502, 504, 506, etc., may be included in VCO 500, in other embodiments (not shown) one or more switched capacitance circuits in accordance with embodiments described herein may be included in other VCOs or other types of circuits.

Figure 6:
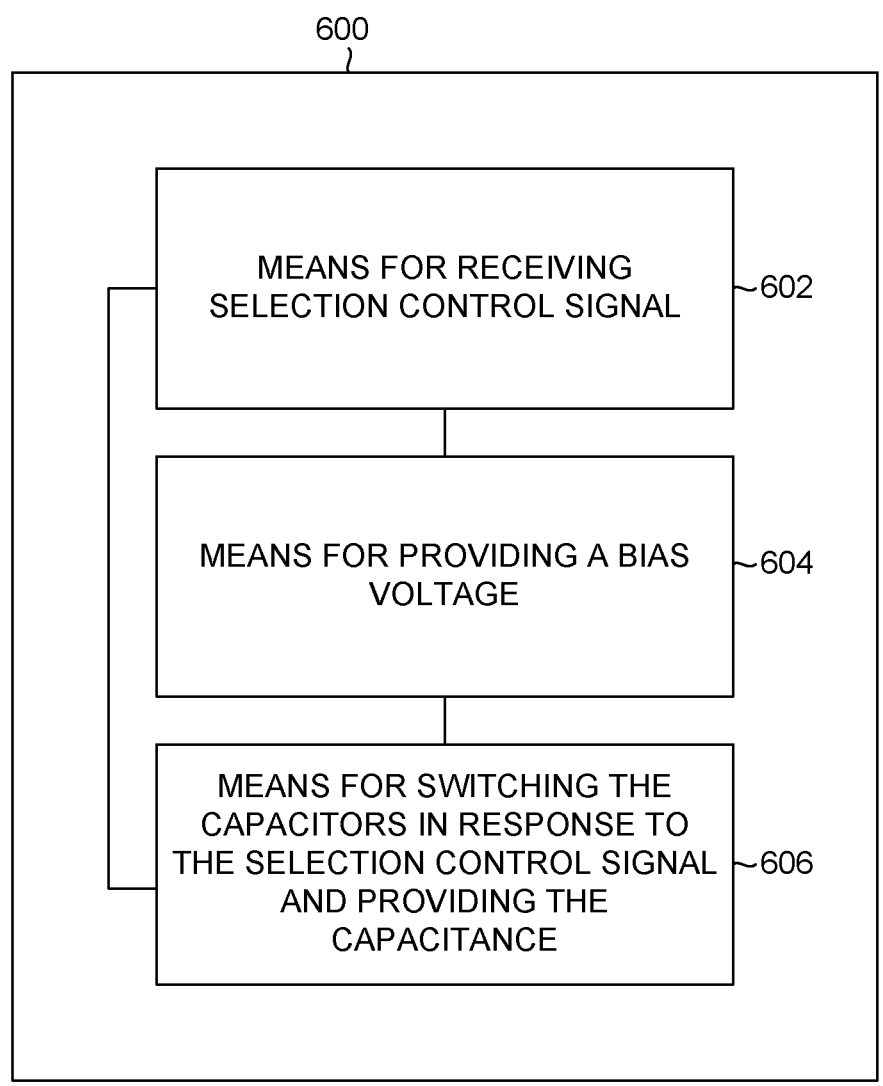
FIG. 6 is a functional block diagram of an exemplary switched capacitance apparatus.

FIG. 6 is a functional block diagram of a switched capacitance apparatus 600. Apparatus 600 includes means 602 for receiving a selection control signal having a state representing one of de-selection of the switched capacitance apparatus 600 and selection of the switched capacitance apparatus 600. Means 602 may be configured to perform the function described above with regard to block 402 of FIG. 4. Means 602 may comprise switching circuits 110 (FIG. 1), 210 (FIG. 2), or 310 (FIG. 3), or elements thereof, such as transistors 216, 218, and 220 of switching circuit 210, or transistors 316 and 320 of switching circuit 310. Further, such means may comprise a node in the circuits 210 or 310, or elements of the transistors 218, 218, 220, 316, and/or 320. For example, such means may comprise a gate terminal of one or more of these transistors or a node or control input (of the circuit 210 and/or 310 and/or VCO 500 coupled to such gate terminal). Apparatus 600 also includes means 604 for providing a bias voltage at a mid-node in response to the selection control signal. Means 604 may be configured to perform the function described above with regard to block 404 of FIG. 4. Means 604 may comprise switching circuits 110, 210, or 310, or elements thereof, such as transistor 220 of switching circuit 210, or transistor 320 of switching circuit 310. Apparatus 600 further includes means 606 for switching first and second capacitors in response to the selection control signal and providing the capacitance between a first output node and a second output node. Means 606 may be configured to perform the function described above with regard to blocks 406 and/or 408 of FIG. 4. Means 606 may comprise switching circuits 110, 210, or 310, or elements thereof, such as transistors 212, 214, 216, and 218 of switching circuit 210, or transistors 312, 314, and 316 of switching circuit 310, or input and output nodes 102 and 104, 202 and 204, or 302 and 304, respectively.

In view of the foregoing, it can be appreciated that switch circuits in accordance with the present disclosure, such as the exemplary embodiments described above, may provide fast switching (e.g., capacitance switching) with low stress voltages. Although switched capacitance circuits in accordance with the present disclosure may be included in any system or device, they may be beneficial in a VCO of a RF transmitter or receiver chip in which fast tuning or frequency switching is desired, because the less complex circuitry may occupy less chip area than more complex switching circuitry.

Therefore, although selected aspects have been illustrated and described in detail, it will be understood that various substitutions and alterations may be made therein without departing from the spirit and scope of the present invention, as defined by the following claims.

What is claimed is:

1. A switched capacitance circuit for selectively providing a capacitance across first and second output nodes in response to a selection control signal, comprising:

a first capacitor coupled between the first output node and a mid-node;

a second capacitor coupled between the second output node and the mid-node; and a switching circuit configured to switch the first and second capacitors in response to the selection control signal, the switching circuit including a first source-follower transistor coupled between the first capacitor and the mid-node, a second source-follower transistor coupled between the second capacitor and the mid-node, a first pull-down transistor coupled to a first node between the first capacitor and the first source-follower transistor and configured to switch in response to the selection control signal, a second pull-down transistor coupled to a second node between the second capacitor and the second source-follower transistor and configured to switch in response to the selection control signal, and a pull-up transistor connected directly to the mid-node and configured to selectively provide a supply voltage to the mid-node in response to the selection control signal, the supply voltage defining a bias voltage.

2. The switched capacitance circuit of claim 1, wherein the switching circuit comprises:

the first source-follower transistor having a first source-follower gate terminal coupled to the supply voltage, a first source-follower drain terminal connected directly to the mid-node, and a first source-follower source terminal connected directly to the first capacitor; and the second source-follower transistor having a second source-follower gate terminal coupled to the supply voltage, a second source-follower drain terminal connected directly to the mid-node, and a second source-follower source terminal connected directly to the second capacitor.

3. The switched capacitance circuit of claim 2, wherein the bias voltage provided at the mid-node is the sole bias voltage in the switching circuit.

4. The switched capacitance circuit of claim 1, wherein:

a gate terminal of the first source-follower transistor is coupled to the supply voltage, a drain terminal of the first source-follower transistor is connected directly to the mid-node, and a source terminal of the first source-follower transistor is coupled to the first capacitor;

a gate terminal of the second source-follower transistor is coupled to the supply voltage, a drain terminal of the second source-follower transistor is connected directly to the mid-node, and a source terminal of the second source-follower transistor is coupled to the second capacitor;

the first pull-down transistor is connected directly to the first node and the source terminal of the first source-follower transistor and is further connected directly to a ground potential and configured to selectively provide the ground potential to the first node in response to the selection control signal; and the second pull-down transistor is connected directly to the second node and the source terminal of the second source-follower transistor and is further connected directly to the ground potential and configured to selectively provide the ground potential to the second node in response to the selection control signal.

5. The switched capacitance circuit of claim 4, wherein:

the pull-up transistor is configured to provide the supply voltage to the mid-node in response to the selection control signal having a state representing de-selection of the switched capacitance circuit;

the first pull-down transistor is configured to provide the ground potential to the first node in response to the selection control signal having a state representing selection of the switched capacitance circuit; and the second pull-down transistor is configured to provide the ground potential to the second node in response to the selection control signal having a state representing selection of the switched capacitance circuit.

6. The switched capacitance circuit of claim 1, wherein the first capacitor, the second capacitor, and the switching circuit define a first capacitance cell, and further comprising a plurality of additional capacitance cells, wherein each of the additional capacitance cells is configured to selectively provide an additional capacitance across the first and second output nodes in response to a respective additional selection control signal, wherein at least one of the additional capacitance cells comprises:

an additional first capacitor coupled between the first output node and an additional mid-node;

an additional second capacitor coupled between the second output node and the additional mid-node; and an additional switching circuit configured to switch the additional first and second capacitors and to provide a bias voltage at the additional mid-node in response to the additional selection control signal.

7. A method for selectively providing a capacitance in a switched capacitance circuit in response to a selection control signal, comprising:

receiving the selection control signal having a state representing one of de-selection of the switched capacitance circuit and selection of the switched capacitance circuit;

selectively providing, by a switching circuit, a bias voltage at a mid-node of the switched capacitance circuit using a pull-up transistor connected directly to the mid-node in response to the selection control signal;

switching first and second capacitors of the switched capacitance circuit in response to the selection control signal by switching a first pull-down transistor coupled to a first node between the first capacitor and a first source-follower transistor in response to the selection control signal and by switching a second pull-down transistor coupled to a second node between the second capacitor and a second source-follower transistor in response to the selection control signal, wherein the first source-follower transistor is coupled between the first capacitor and the mid-node, and the second source-follower transistor is coupled between the second capacitor and the mid-node; and selectively providing the capacitance between a first output node and a second output node, wherein the first capacitor is coupled between the first output node and the mid-node, and the second capacitor is coupled between the second output node and the mid-node.

8. The method of claim 7, wherein selectively providing the capacitance comprises:

providing the capacitance across the first capacitor, the first source-follower transistor, the second source-follower transistor, and the second capacitor connected in series with each other, wherein the first source-follower transistor has a first source-follower gate terminal coupled to the supply voltage, a first source-follower drain terminal connected directly to the mid-node, and a first source-follower source terminal connected directly to the first capacitor, and the second source-follower transistor has a second source-follower gate terminal coupled to the supply voltage, a second source-follower drain terminal connected directly to the mid-node, and a second source-follower source terminal connected directly to the second capacitor.

9. The method of claim 8, wherein:

selectively providing the bias voltage comprises providing the supply voltage to the mid-node using the pull-up transistor in response to the selection control signal having a state representing de-selection of the switched capacitance circuit;

switching the first pull-down transistor comprises providing a ground potential to the first node in response to the selection control signal having a state representing selection of the switched capacitance circuit; and switching the second pull-down transistor comprises providing the ground potential to the second node in response to the selection control signal having a state representing selection of the switched capacitance circuit.

10. A switched capacitance apparatus for selectively providing a capacitance in response to a selection control signal, comprising:

means for receiving the selection control signal, the selection control signal having a state representing one of de-selection of the switched capacitance apparatus and selection of the switched capacitance apparatus;

means for selectively providing a bias voltage at a mid-node in response to the selection control signal using a pull-up transistor connected directly to the mid-node; and means for switching first and second capacitors in response to the selection control signal and for selectively providing the capacitance between a first output node and a second output node by switching a first pull-down transistor coupled to a first node between the first capacitor and a first source-follower transistor in response to the selection control signal and by switching a second pull-down transistor coupled to a second node between the second capacitor and a second source-follower transistor in response to the selection control signal, wherein the first source-follower transistor is coupled between the first capacitor and the mid-node, and the second source-follower transistor is coupled between the second capacitor and the mid-node.

11. The apparatus of claim 10, wherein the means for switching first and second capacitors in response to the selection control signal and for selectively providing the capacitance comprises:

the first capacitor, the first source-follower transistor, the second source-follower transistor, and the second capacitor connected in series with each other, wherein the first source-follower transistor has a first source-follower gate terminal connected directly to the supply voltage, a first source-follower drain terminal connected directly to the mid-node, and a first source-follower source terminal connected directly to the first capacitor, and the second source-follower transistor has a second source-follower gate terminal connected directly to the supply voltage, a second source-follower drain terminal connected directly to the mid-node, and a second source-follower source terminal connected directly to the second capacitor.

12. The apparatus of claim 10, wherein:

the means for selectively providing the bias voltage at the mid-node in response to the selection control signal comprises means for providing the supply voltage to the mid-node using the pull-up transistor in response to the selection control signal having a state representing de-selection of the switched capacitance apparatus;

the means for switching the first pull-down transistor comprises means for providing a ground potential to the first node in response to the selection control signal having a state representing selection of the switched capacitance apparatus; and the means for switching the second pull-down transistor comprises means for providing the ground potential to the second node in response to the selection control signal having a state representing selection of the switched capacitance apparatus.

13. A switch circuit comprising:

a first capacitor coupled to a first output node;

a second capacitor coupled to a second output node;

a first transistor coupled between the first capacitor and a mid-node, the first transistor comprising a gate coupled to a supply;

a second transistor coupled between the second capacitor and the mid-node, the second transistor comprising a gate coupled to the supply;

a third transistor directly coupled between the mid-node and the supply, the third transistor comprising a gate coupled to a control;

a fourth transistor coupled to a first node between the first capacitor and the first transistor, the fourth transistor comprising a gate coupled to the control; and a fifth transistor coupled to a second node between the second capacitor and the second transistor, the fifth transistor comprising a gate coupled to the control.

14. The switch circuit of claim 13, wherein the switch circuit is included in a voltage-controlled oscillator (VCO), comprising:

a cross-coupled transistor pair;

an inductor coupled to the cross-coupled transistor pair; and a capacitor bank comprising the switch circuit, wherein the first output node is coupled between a first transistor of the cross-coupled transistor pair and a first terminal of the inductor, and wherein the second output node is coupled between a second transistor of the cross-coupled transistor pair and a second terminal of the inductor.

* * * * *